United States Patent [19]

Gordon

[11] Patent Number: 4,595,908
[45] Date of Patent: Jun. 17, 1986

[54] CIRCUIT USING SLOW SAMPLING RATE A-D CONVERTER WHICH PROVIDES HIGH SAMPLING RATE RESOLUTION

[75] Inventor: James H. Gordon, Fairfax, Va.

[73] Assignee: General Research Corporation, McLean, Va.

[21] Appl. No.: 386,394

[22] Filed: Jun. 8, 1982

[51] Int. Cl.⁴ ............................................ H03K 13/02
[52] U.S. Cl. ................................ 340/347 SH; 73/610
[58] Field of Search ................ 340/347 AD, 347 SH; 364/507; 73/901, 597, 598, 600, 612, 614, 609, 610, 611

[56] References Cited

U.S. PATENT DOCUMENTS

| | | | |
|---|---|---|---|
| 4,089,226 | 5/1978 | Kraska | 73/614 |
| 4,354,388 | 10/1982 | Diepers | 73/612 |

FOREIGN PATENT DOCUMENTS

| | | | |
|---|---|---|---|
| 0147054 | 9/1982 | Japan | 73/609 |
| 2089039 | 6/1982 | United Kingdom | 73/609 |

Primary Examiner—Charles D. Miller
Attorney, Agent, or Firm—Jay M. Cantor

[57] ABSTRACT

The disclosure relates to a circuit using a relatively inexpensive relatively slow sampling rate A-D converter which provides resolution which is far superior to that obtained normally from the A-D converter being used. This is accomplished by providing a variable delay circuit wherein the delay is controllable. The maximum delay of the delay circuit is matched to the sampling rate of the A-D converter being used. The delay is then varied so that trigger pulses for commencing a sampling cycle are commenced at different points along the wave or information signal being sampled so that, after several different amounts of delay have been provided to information initiating triggering pulses, the information signal will have been sampled at various points therealong to provide the higher degree of resolution required while still using a relatively inexpensive slow sampling rate A-D converter.

8 Claims, 3 Drawing Figures

CIRCUIT USING SLOW SAMPLING RATE A-D CONVERTER WHICH PROVIDES HIGH SAMPLING RATE RESOLUTION

BACKGROUND OF THE INVENTION

1. Field of the Invention

The invention relates to a system for sampling information signals wherein the sampling point on the wave is varied by means of a controlled variable delay line to provide sampling at different points along the information signal on successive samplings.

2. Description of the Prior Art

It is often necessary to sample signals at a sampling rate above 40 MHz to provide high resolution digital outputs. Unfortunately, in the prior art, this can only be done with very exotic and expensive circuitry or by providing A-D converters having lower resolution output despite the high sampling rate due to a reduction in the number of output lines. In either case, there is a tradeoff required in order to provide the high sampling rate required, in one case there is an economic penalty and in the other case, there is a resolution penalty. For this reason, where cost is a significant factor, it often becomes economically unfeasible to provide the required sampling rates in converting an analog to a digital signal.

SUMMARY OF THE INVENTION

In accordance with the present invention, there is provided a system in which the resolution of the expensive prior art A-D converters is provided while using a relatively inexpensive A-D converter. This is accomplished by providing a delay circuit for providing trigger pulses, the amount of the delay in the delay circuit being matched to the frequency of the A-D converter. The delay line is variable in its delay, the amount of delay being externally controllable by means of input lines which vary the point on the information signal being sampled at which the trigger commences. Therefore, in the event eight sampling points on an information signal are to be obtained, three input lines are required to the delay line to provide the possibility of eight different delay levels by providing a binary code on each input line. In this way, after eight scans of the information signal being provided, a high resolution signal will be provided to a memory via the A-D converter.

BRIEF DESCRIPTION OF THE DRAWING

FIG. 3 is a timing diagram of the various components wherein each division represents 6.25 nanoseconds.

DESCRIPTION OF THE PREFERRED EMBODIMENT

Figure 1:
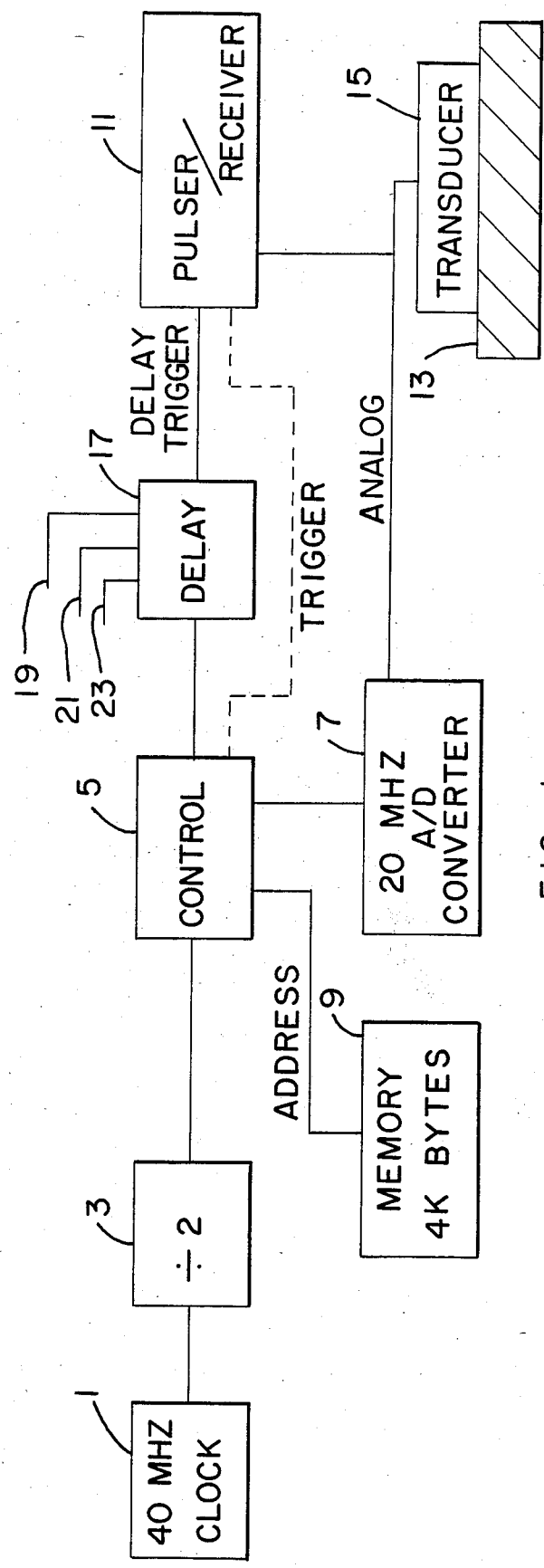
FIG. 1 is a block diagram of a circuit in accordance with the present invention.

Referring now to FIG. 1, there is shown a 40 MHz clock 1 which produces pulses at a 40 MHz rate, these pulses being divided by 2 to provide 20 MHz pulses by a divider 3. The 20 MHz pulses are then transmitted to a control circuit 5 which, in response to each pulse thereto, generates convert pulses to an A-D converter 7 at a 20 MHz rate. These pulses are essentially square wave pulses. The A-D converter 7 has a maximum operating rate of 20 MHz as explained hereinabove. The control 5 also generates address control in response to each of the pulses from divider 3 to a memory 9 to fill the memory with data received from the A-D converter 7 as will be explained hereinbelow. The memory is preferably a 4K byte memory in the present embodiment. The control unit 5 also provides a trigger pulse shown in phantom to a pulser/receiver 11. The pulser/receiver provides a burst of energy which is coupled into a block of material 13 under test by a transducer 15. The reflection or echo is picked up by the transducer 15 and transmitted to the 20 MHz A-D converter 7 which converts the analog signal received from the transducer 15 to a digital signal and transmits the digital signal to the memory 9 wherein the signal is stored, the memory 9 acting as a buffer. Up to 4K bytes of memory are used to store the echo from the transducer 15 which has been sampled at a 20 MHz rate by the A-D converter 7. This portion of the circuit is prior art.

The problem in the present state of the art is that A-D converters can only be purchased at reasonable cost with scanning rates of up to 40 MHz for an 8 bit output. In order to sample at a rate higher than 40 MHz in the present state of the art, it is necessary either to use highly exotic and very expensive equipment or lose bits by going for example, to a 7 bit or 6 bit converter. The use of a smaller number of bits provides a loss in resolution. So it is necessary to find a way to sample more rapidly than 40 MHz (20 MHz in the present embodiment using a 20 MHz A-D converter). It should be understood that the same principle can be used for A-D converters of lesser sampling rate whereby it is desired to obtain results equivalent to converters having a much higher sampling rate than the one being used.

In accordance with the present invention, the echo from the transducer 15 will be sampled at a 20 MHz rate using a 20 MHz A-D converter (i.e. the sampling rate will be the maximum sampling rate of the A-D converter), but the sampling will be altered on scans of the wave to different points in the cycle so that the wave can be sampled at numerous points therealong to provide a higher degree of resolution. In order for this to take place, the information signal received from transducer 15 must be repetitive over a finite period of time over which the samples will be taken, it must be totally under control of the A-D converter and its starting time must be exactly controlled. There are not problems since they are inherent in the circuitry.

The procedure for permitting the system to sample at various points along the wave in successive scans is provided by inserting a delay circuit 17 having plural taps, three such taps 19, 21 and 23 being shown in the preferred embodiment. The trigger output from the control unit 5 to the pulser/receiver 11 shown in phantom is not a part of the circuit in accordance with the invention and is replaced by the delay circuit to be explained hereinbelow.

Referring now to the delay circuit 17, the taps 19, 21 and 23 are designed to receive a binary code so that eight different amounts of delay are capable of being obtained from the delay element 17. Such delay circuits are well known in the prior art and are readily available commercially. By providing different amounts of delay in the delay circuit 17, the trigger pulse for operating the pulser/receiver 11 will be altered as to its location in the cycle of the information signal received from the transducer 15 to provide added resolution by sampling at various points along the information signal from the transducer 15. It should be understood that the delay circuit 17 can have any number of control leads 19, 21 and 23, either more or less, to provide either greater or lesser resolution. It is merely necesary that the echo signal from the transducer 15 be repetitive over the number of samplings cycles being utilized. The total delay of the delay line 17 in the present embodiment must be 50 nanoseconds because 20 MHz is the equivalent of a sampling rate every 50 nanoseconds. In the present embodiment, there is a constant inherent delay of seven nanoseconds in the delay line 17 when the code on the lines 19, 21 and 23 is a zero and this delay is increased 6.25 nanoseconds for each step as the binary code on the lines 19,21 and 23 is increased through the number 7. That means that if the number corresponding to the code on lines 19, 21 and 23 is a zero or 000 in binary, the delay will be seven nanoseconds. (It should be understood that the inherent delay can vary from delay line to delay line, it merely being necessary that all samples after the first sampling be at regular times relative to the start of the information signal.) If the binary number is 001, the delay will be 7 plus 6.25 or 13.25 nanoseconds. For each increase of 1 in the binary number, the delay will be increased 6.25 nanoseconds. So the 50 nanoseconds sampling rate has been broken up into eight different spaces in time. For A-D converters operating at other than a 20 MHz rate, the delay circuit delay will be matched accordingly as explained above.

The system will operate as described above without the delay line except that the delay will be set initially for a binary code of zero and a shot will be taken and stored in the memory 9. The binary code on the delay line 17 will then be switched to a one and a shot taken and the result stored in the memory 9. This will continue through the number 7 to provide eight sampling points along the wave. If desired, the eight sampling points can be sampled repetitively a number of times and the results averaged in order to correct for any possible error at a single sampling point.

It can be seen that, in accordance with the present invention, there is provided a sampling rate equivalent to 160 MHz utilizing a 20 MHz A-D converter. It is also apparent that the number of sampling points can be materially increased to provide even higher sampling rates, again using an inexpensive low sampling rate A-D converter.

In operation, a 40 MHz clock 1 will provide pulses at a 40 MHz rate. This rate will be divided by the divider 3 to provide an output of 20 MHz pulses therefrom. These pulses will operate in a control circuit 5 to address the memory 9, to activate the 20 MHz A-D converter 7 and to provide a pulse to the delay circuit 17. The output of the delay circuit 17 will operate a pulser/receiver 11 which will provide a signal to operate the transducer 15 to provide energy to the element 13 under test. The echo from the signal induced in the element under test will be received by the transducer 15 and, being in analog form, will pass to the A-D converter 7. The converter will convert the analog signal to a digital signal by sampling it at a 20 MHz rate and provide the digital output to the buffer memory 9 in the address designated by the control 5.

Figure 2:
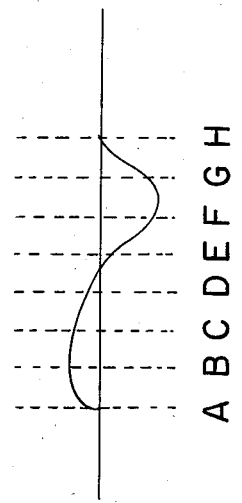
FIG. 2 is a typical information wave showing sampling points thereon in accordance with the present invention.

The delay circuit 17 is variable in accordance with the input signal on the lines 19, 21, and 23. It can therefore be seen that, if the input to the lines 19, 21 and 23 is a binary zero and there is no delay, the sampling will take place at the point A in FIG. 2 of the information signal shown. If the binary signal on the lines 19, 21 and 23 is "001", the sampling will take place at B in FIG. 2 and so forth through H in FIG. 2. It can be seen that this will occur because the delay circuit 17 will cause a delay to take place in the operation of the transducer 15 as compared with the commencement of operation of the A-D converter 7 which receives its control signal prior to operation of the delay circuit 17. It is therefore seen that, by having eight different samplings of the echo received by transducer 15 by having eight different binary numbers 0 through 7 placed on the leads 19, 21 and 23, the sampling will take place at eight different points A through H along the information wave as shown in FIG. 2.

In all of the above analysis, it must be recalled that necessary conditions are that the echo to transducer 15 is repeatable during all scanning cycles and that the wave will commence at the same time during each cycle. It is also noted that each of the blocks shown in the circuit of FIG. 1 is well known in the art and that the blocks themselves individually form no part of the invention.

By way of example, when an A-D converter has a basic known maximum sampling rate and the desired sampling rate is higher than the said maximum rate, the results of the higher sampling rate is achieved using the lower rate converter by utilizing an incremental delay of a digitally controlled delay line which controls the delay of the trigger relative to the recording process. It is necessary that the data being recorded be triggered and repeatable at least in the ratio of the desired sampling rate to the maximum sampling rate of the converter.

EXAMPLE 1

Using a 20 MHz basic sampling rate and desiring a 160 MHz sampling rate:

$$\text{minimum records} = \frac{160,000,00}{20,000,00} = 8$$

$$\text{incremental delay} = \frac{50 \text{ nanoseconds}}{8} = 6.25 \text{ nanoseconds}$$

EXAMPLE 2

Using a 20 MHz basic sampling rate and desiring a 1000 MHz sampling rate:

$$\text{minimum records} = \frac{1,000,000,000}{20,000,000} = 50$$

$$\text{incremental delay} = \frac{50 \text{ nanoseconds}}{50} = 1 \text{ nanosecond}$$

If a 160 MHz desired sampling rate is set up using a 20 MHz basic sampling rate and 8 incremental delays of 6.25 nanoseconds each, it should be noted that lower sampling rates are easily achieved.

To achieve an 80 MHz sampling rate, use 2 increments at a time of the delay line and record 4 events. To achieve 40 MHz sampling rate, use 4 increments at a time of the delay line and record 2 events.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

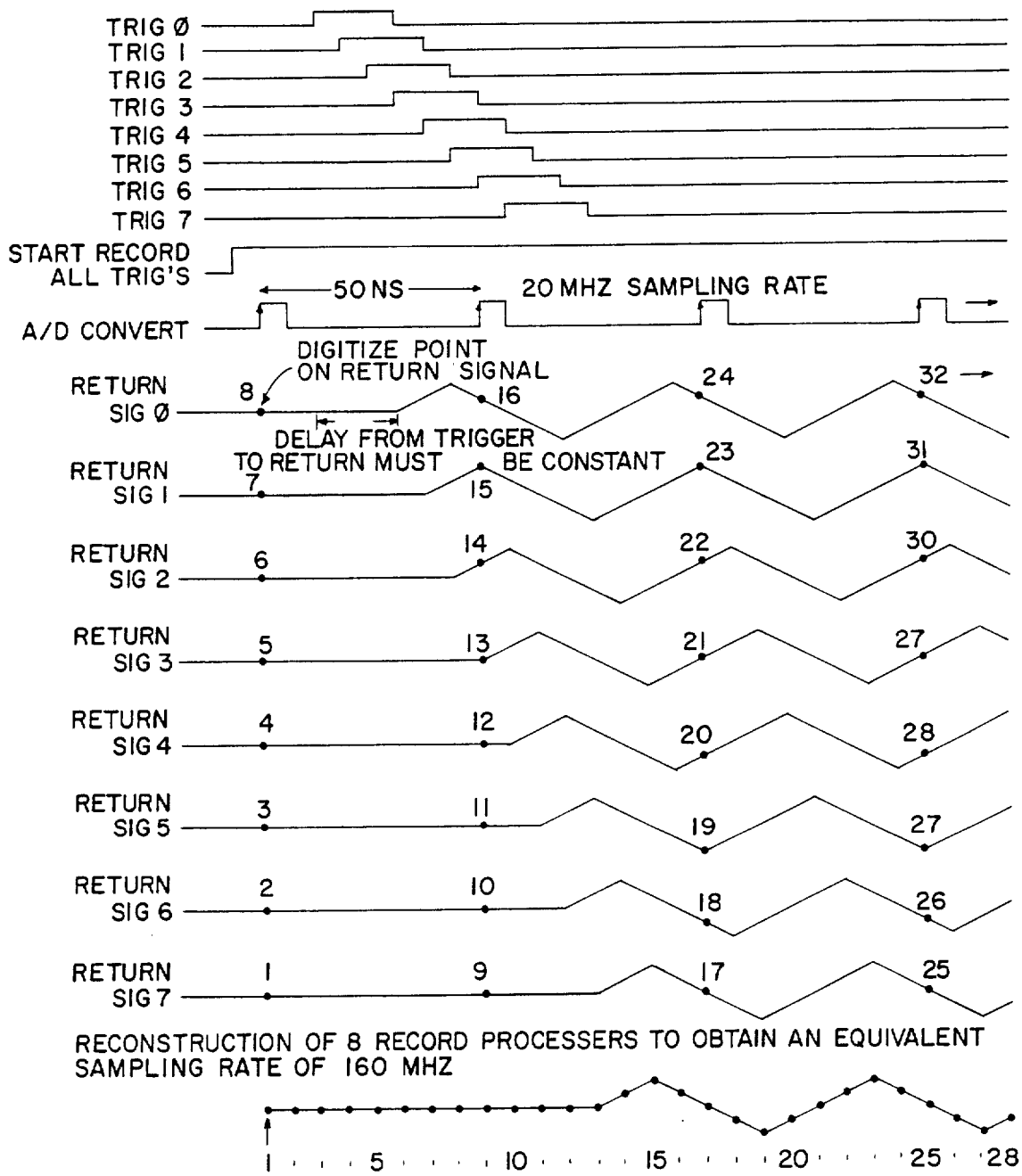

What is claimed is:

1. A converter system for sampling a repetitive series of pulses which comprises, in combination:
   (a) an analog to digital converter having a predetermined maximum sampling rate,
   (b) means for generating pulses at a rate no greater than said maximum sampling rate,
   (c) control means responsive to said pulses for initiating sampling by said converter,
   (d) delay means responsive to pulses from said control means for initiating a signal therefrom after a variable preselected time delay, said delay means including a delay circuit and selectively controllable means for variably controlling the delay of said delay circuit during sampling of said series of pulses, and
   (e) means responsive to a signal from said delay means for transmitting an analog information signal to said converter.

2. A converter system as set forth in claim 1 further including storage means responsive to said control means for selectively storing digital data from said converter.

3. A converter system as set forth in claim 2 wherein the delay of said delay means is matched to the conversion rate of said converter.

4. A converter system as set forth in claim 3 further including pulser/receiver means responsive to said delay means for providing an output pulse and transducer means responsive to said pulser/receiver means for transmitting energy to and receiving energy from a circuit under test.

5. A converter system as set forth in claim 2 further including pulser/receiver means responsive to said delay means for providing an output pulse and transducer means responsive to said pulser/receiver means for transmitting energy to and receiving energy from a circuit under test.

6. A converter system as set forth in claim 1 further including pulser/receiver means responsive to said delay means for providing an output pulse and transducer means responsive to said pulser receiver means for transmitting energy to and receiving energy from a circuit under test.

7. A converter system as set forth in claim 1 wherein the delay of said delay means is matched to the conversion rate of said converter.

8. A converter system as set forth in claim 7 further including pulser/receiver means responsive to said delay means for providing an output pulse and transducer means responsive to said pulser/receiver means for transmitting energy to and receiving energy from a circuit under test.

* * * * *

UNITED STATES PATENT AND TRADEMARK OFFICE
CERTIFICATE OF CORRECTION

PATENT NO. : 4,595,908

DATED : 17 June 1986

INVENTOR(S) : James H. Gordon

It is certified that error appears in the above-identified patent and that said Letters Patent is hereby corrected as shown below:

The sheet of drawings comprising Fig. 3 should be inserted in the Letters Patent.

Signed and Sealed this

Eighth Day of August, 1989

*Attest:*

DONALD J. QUIGG

*Attesting Officer*     *Commissioner of Patents and Trademarks*